United States Patent [19]

Kalinoski et al.

[11] Patent Number: 4,757,228

[45] Date of Patent: Jul. 12, 1988

[54] DOUBLE-TUNING-FORK RESONATOR WITH MEANS TO SENSE TINE BREAKAGE

[75] Inventors: Richard W. Kalinoski, Rumford, R.I.; Edwin L. Karas, Mansfield, Mass.; Jonathan D. Wexler, Los Angeles, Calif.

[73] Assignee: The Foxboro Company, Foxboro, Mass.

[21] Appl. No.: 7,679

[22] Filed: Jan. 27, 1987

[51] Int. Cl.⁴ .............................................. H01L 41/08
[52] U.S. Cl. .................................. 310/316; 310/317; 310/366; 310/370
[58] Field of Search ............... 310/316, 317, 319, 366, 310/370; 73/862.59

[56] References Cited

U.S. PATENT DOCUMENTS

| | | | |
|---|---|---|---|
| 4,372,173 | 2/1983 | Eer Nisse et al. | 73/862.59 |
| 4,379,244 | 4/1983 | Dinger | 310/370 X |
| 4,385,473 | 5/1983 | Aoki et al. | 310/370 X |
| 4,415,827 | 11/1983 | Chuang | 310/370 |
| 4,469,979 | 9/1984 | Chuang | 310/370 |
| 4,641,052 | 2/1987 | Kobayashi | 310/317 |

FOREIGN PATENT DOCUMENTS 1201692 12/1985 U.S.S.R. .................. 73/862.59

Primary Examiner—Mark O. Budd
Attorney, Agent, or Firm—Parmelee, Bollinger & Bramblett

[57] ABSTRACT

A double-tuning-fork (DTF) resonator having electrical circuitry operable, if either tine breaks, to develop a characteristic electrical circuit condition which is detected to produce an indication of failure. In one preferred embodiment, the circuitry includes a dual series circuit for energizing the electrodes on the DTF tines, with (1) a first series circuit passing down one tine to the remote end thereof, across the support segment at that end of the DTF, and back up the other tine, and (2) a second series circuit passing down the other tine to the remote end thereof, across said support segment at that end, and back up the first-mentioned tine. If either tine breaks, or if there is fracture of another part of the DTF carrying an electrode energizing lead, vibratory excitation of both tines ceases, and the output signal is caused to go to a level (e.g. zero) clearly indicating failure of the instrument.

17 Claims, 4 Drawing Sheets

DOUBLE-TUNING-FORK RESONATOR WITH MEANS TO SENSE TINE BREAKAGE

BACKGROUND OF THE INVENTION

1. Field of the Invention

This invention relates to resonant sensors of the type known as double-tuning-forks (DTFs). Such devices can be likened to a pair of tuning forks with their tines secured end-to-end. More particularly, this invention relates to such sensors which are coupled to an electrical circuit such as an oscillator producing output signal corresponding to the resonant frequency of the DTF, which frequency in turn is responsive to a condition such as applied force.

2. Description of the Prior Art

Resonant sensors of the DTF type have been known for many years. These devices commonly are made from piezoelectric materials such as crystalline quartz. The resonant frequency typically is determined by coupling the piezoelectric excitation electrodes to an oscillator which produces an oscillatory signal at the resonant frequency of the DTF. The frequency of that signal can be measured in any of various ways. There is extensive prior art describing pertinent characteristics of DTF sensors as well as the many applications that have been proposed.

Because the resonant frequency of a DTF is a function of force applied to the element, many applications involve force measurement, e.g. to measure the differential-pressure developed across an orifice plate to determine the flow rate of a fluid developed in an industrial process. For a sampling of prior art disclosures relating to DTFs, reference may be made to U.S. Pat. Nos. 3,238,789; 4,215,570; 4,299,122; 4,321,500 and 4,372,173.

DTF sensors offer important advantages when used to measure force. In particular, because DTFs have a very high mechanical Q, they are able to make force measurements with high resolution. Also, such sensors can be manufactured economically by use of photolithographic techniques of the kind which have been extensively developed in the semiconductor industry.

Such DTF sensors typically are very small in size. For example, one unit for measuring forces up to 300 grams was one-half inch long, with tines slightly less than 0.01" square and one-third inch long. With such small size, DTFs are relatively fragile, and it has been found from experience that some percentage of them can be expected to break in usage, such as due to excessive shock or vibration. Particularly sensitive to breakage are the vibratory beams or tines of the fork, because of their small cross-sectional dimensions, and due to the fact that inclusions can develop during the crystal growth processes and small pits can develop during the chemical etching processes.

Breakage of a single tine can create a severe problem because the remaining tine may continue to vibrate, but at a frequency different from that obtained when both tines were vibrating. Such continued vibration can occur in prior art DTFs because the piezoelectric excitation electrodes are activated through connection leads which branch out to provide two parallel circuits running down both tines away from the area where connections are made to the external lead wires. Thus if one tine fractures, electrodes on the remaining tine are still energized so as to maintain vibration. When one tine is broken, the stress on the intact tine doubles, and its resonant frequency increases. Accordingly, the output of the instrument will change, so as to produce an erroneous measurement, possibly double that of the true measurement. This is because a DTF with both tines active, or with just one of its tines intact, has approximately the same vibratory frequency as a function of applied stress, so that the increased stress on the intact tine produces a corresponding change in vibratory frequency.

Another undesirable mode of failure can occur when the DTF fractures in a lead-carrying region at the remote end of the crystal, i.e. at the end remote from the external wire-connection area. In this case, both tines would remain intact and can resonate at the zero stress frequency because the sensor mechanism is unable to apply stress to the resonator, thereby falsely indicating zero force input from the process.

Of particular concern is that such errors may not be evident in any way to the user of the instrument. Such erroneous measurements can of course cause serious trouble in many applications, as where the sensor is used as an integral part of an overall instrumentation system for an industrial process or the like. Thus, a solution to this problem of tine breakage is urgently needed.

SUMMARY OF THE INVENTION

In accordance with the invention, a double-tuning-fork resonator is provided with fail-safe electrical circuitry operable, in response to breakage of either tine, to develop a corresponding electrical circuit characteristic which in turn is detected to produce a failure indication. In certain embodiments, the electrical circuitry serially traverses both tines of the DTF, passing down one tine to the end thereof, across the support segment at the end of the DTF to the other tine, and back up that other tine. This series circuitry is coupled to electrical means operable to produce a failure indication in response to any interruption of the serial circuitry caused by breakage of either DTF tine. In a specially preferred embodiment, the circuitry includes a dual series circuit for energizing the electrodes on the DTF tines, with (1) a first series circuit passing down one tine to the remote end thereof, across the support segment at that end of the DTF, and back up the other tine, and (2) a second series circuit passing down the other tine to the remote end thereof, across said support segment at that end, and back up the first mentioned tine. The series circuitry is coupled to an associated oscillator arranged to electrically excite the sets of electrodes (films or other coatings) formed on the tines, to produce vibration thereof. When one tine breaks, vibratory excitation to both tines is entirely interrupted, due to the serial nature of the energizing circuitry, and to the fact that adjacent pairs of positive and negative electrodes at any region of the DTF must be simultaneously energized to produce a bending force and resulting vibratory motion. Thus in this preferred embodiment the DTF ceases vibration completely, producing an indication of failure of the sensor. The complete cessation of vibration provides for "fail-safe" operation of the sensor.

Other aspects and advantages of the invention will in part be pointed out in, and in part apparent from, the following description of preferred embodiments of the invention, considered together with the accompanying drawings.

DESCRIPTION OF PREFERRED EMBODIMENTS

Figure 1:
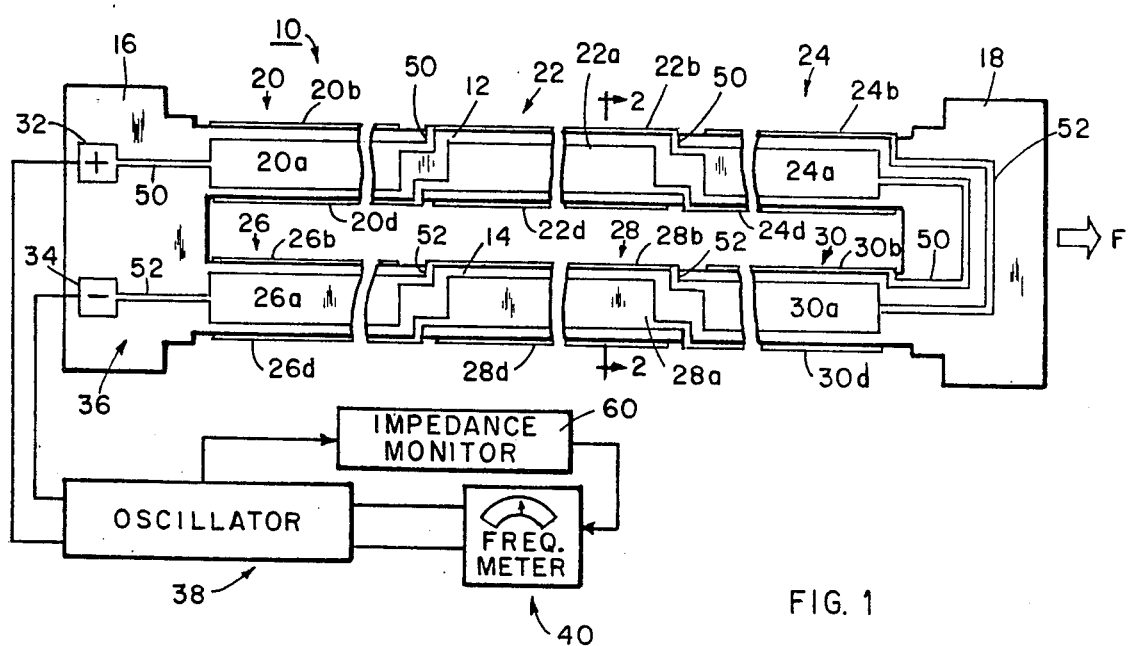
FIG. 1 is a plan view of a force-sensing double-tuning-fork (DTF) in accordance with the present invention, coupled to an oscillator the output of which is directed to a frequency meter.

Referring first to FIG. 1, there is shown a double-tuning-fork (DTF), generally indicated at 10, in the form of a flat piezoelectric element comprising a pair of parallel beams or tines 12, 14 joined at their ends by respective support segments 16, 18. The left-hand segment 16 typically will be clamped in place, while an input force illustrated at F is applied to the other segment, thereby controlling the resonant frequency of the DTF in accordance with the applied force.

Figure 2:
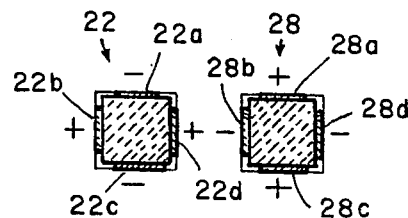
FIG. 2 is a cross-sectional view taken along line 2—2 of FIG. 1.

The DTF 10 is formed integrally from a sheet of piezoelectric material, usually crystalline quartz, by photolithographic techniques known in the art. Such techniques also are employed to form on the tines of the DTF groups of conductive electrodes generally indicated at 20–30. Commonly (see, for example, U.S. Pat. No. 4,469,979), six such groups of electrodes are employed, three groups on each tine, as shown in FIG. 1. Each group consists of four electrodes deposited respectively on the four surfaces of the tine by photolithographic techniques. The individual electrodes of each group, as shown in the sectional view of FIG. 2, are designated herein by lower case letters "a" through "d".

The left-hand end 16 of the DTF carries a pair of terminal pads 32, 34 for making connection to the electrodes 20–30 through conductive leads generally indicated at 36, and also formed by photolithographic techniques together with the electrodes. These leads (to be described in more detail hereinbelow) connect the upper pad 32 to one set of electrodes 20a,c; 22b,d; 24a,c; 26b,d; 28a,c; and 30b,d, distributed along both tines. The other pad 34 is connected to a second set of electrodes, also distributed along both tines, and comprising all of the remaining electrodes not in the first set.

It will be seen that opposed pairs of electrodes of the first set have counterpart opposed pairs of electrodes in the second set. For example, referring to FIG. 2, the top and bottom pair 22a,c of the group of electrodes 22 have a counterpart pair 22b,d which are the side electrodes of the group. The top and bottom electrodes are energized with one polarity of an applied a-c voltage, while the side pair are energized with the other polarity of the a-c voltage. The electrodes of each group cooperate in known fashion to produce the desired vibratory piezoelectric deformation of the DTF.

In order to produce the bending force on the tine needed to effect vibratory motion, both pairs of electrodes of each group must be energized simultaneously. That is, one opposed pair must receive a signal of one polarity, and the other pair must, at the same time, receive a signal of the other polarity. If either pair is de-energized while the other pair is energized, no force (and thus no motion) will be produced. Accordingly, interrupting the energization circuit for either pair of electrodes, of all groups of electrodes, is sufficient to assuredly prevent vibration of all sections of both tines.

To energize the DTF all of the electrodes 20–30 are connected through the pads 32, 34 to an oscillator 38 which oscillates at the resonant frequency of the DTF as is understood in the art. The frequency of oscillation thus provides a measure of the applied force, and may be indicated by a frequency meter 40 or otherwise utilized, for example, as part of an instrumentation system.

Referring now more specifically to the arrangement for connecting the pads 32, 34 to the electrodes 20–30, a distinctive feature of this arrangement is that it comprises series circuitry which passes down one tine to the end thereof, across the support segment 18, and back up the other tine. If either tine breaks, this series circuitry will be interrupted, thereby interrupting the operative connection between the oscillator 38 and the electrodes of both tines. Consequently, the oscillator in that event ceases operation, and its output signal goes to zero, indicating failure of the sensor.

In one specially preferred embodiment, the series circuitry referred to above is a dual series circuit, comprising a first series circuit connecting one pad 32 to all of the electrodes of the first set of electrodes as identified above, and a second series circuit connecting the other pad 34 to the second set of electrodes referred to above. This arrangement is schematically outlined in FIG. 3 which shows first and second series circuits 42, 44 extending from the pads 32, 34 down the respective tines, across the support segment at the remote end (via circuit segments 42a, 44a), and back up the other tine to dead end points 42b, 44b. To simplify understanding, these circuits 42, 44 are shown as straight-line conductors, but in reality they are topologically somewhat more complex, in order to effect connection to the respective sets of electrodes on all four sides of each tine.

One-half of the electrodes of the first set identified above as connected to the upper pad 32 are on one tine, and the other half are on the other tine; similarly, the electrodes of the second set connected to the other pad 34 are divided equally between the two tines. The first set of electrodes identified above can also be defined as (referring againg to FIG. 1): the top and bottom electrodes of the first group 20, the side electrodes of the second group 22, the top and bottom electrodes of the third group 24, the side electrodes of the fourth group 26, the top and bottom electrodes of the fifth group 28, and the side electrodes of the sixth group 30. The second set of electrodes can similarly be defined as: the side electrodes of the first group 20, the top and bottom electrodes of the second group 22, the side electrodes of the third group 24, the top and bottom electrodes of the fourth group 26, the side electrodes of the fifth group 28, and the top and bottom electrodes of the sixth group 30.

The plan view of FIG. 1 shows the conductive leads 50, 52 which are formed on the upper surface of the DTF to serve as the dual series circuits (42, 44) referred to above, connecting the pads 32, 34 with all of the electrodes. The electrodes on the sides and bottom of the tines are connected to the pads 32 or 34 by conductive leads which join the upper surface leads and extend down along sides of the DTF to the side electrodes, and to the bottom surface for connection to the bottom electrodes. Since portions of these conductive leads cannot be seen in FIG. 1, the perspective views of FIGS. 4 and 5 have been included to show these other portions.

Figure 6:
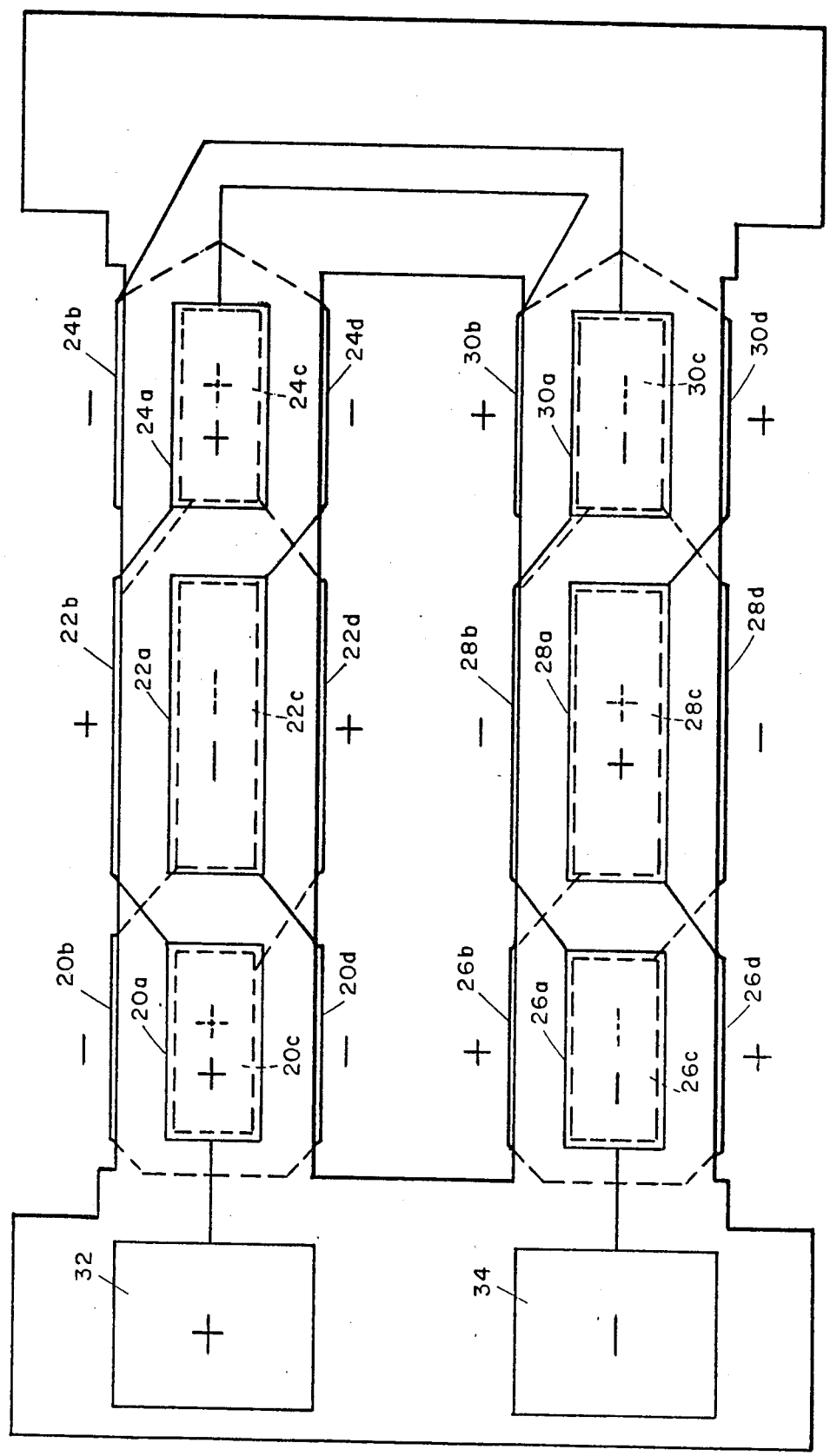
FIG. 6 is a diagrammatic plan view illustrating the electrode connections for the DTF of FIGS. 1 and 2.

FIG. 6 is a diagrammatic plan view presentation of the piezoelectric electrodes 20-30 and connections therebetween. (Note that this view is not to scale, in order to improve the clarity of the presentation.) In this figure, interrupted (dashed) lines are used to illustrate those electrodes and leads which normally would be out of sight, i.e. on the undersurface of the DTF. The terminal pads 32, 34 carry relative polarity markings (+; —), as do the electrodes connected thereto, in order to show the connection pattern. (Of course, the actual signal on the pads is a-c, not d-c.)

Figure 3:
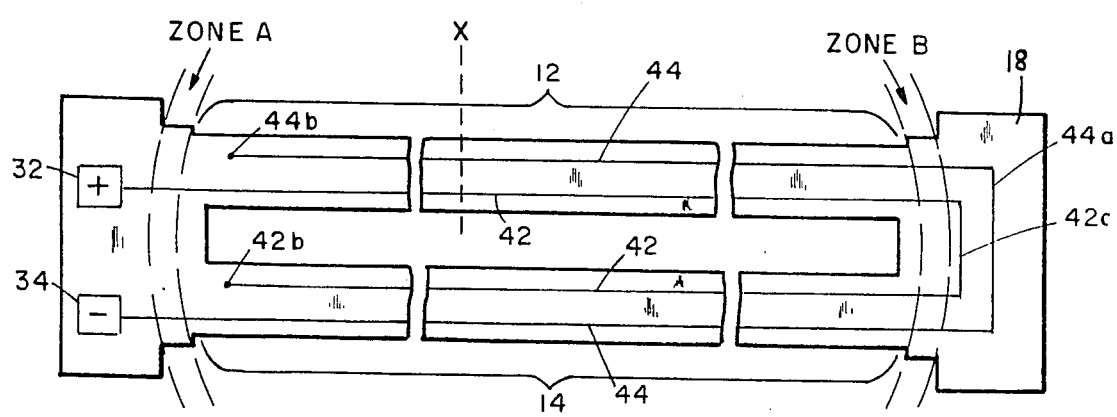
FIG. 3 is a plan view of a DTF illustrating schematically the layout of a dual series circuit for energizing the electrodes.
Figure 4:
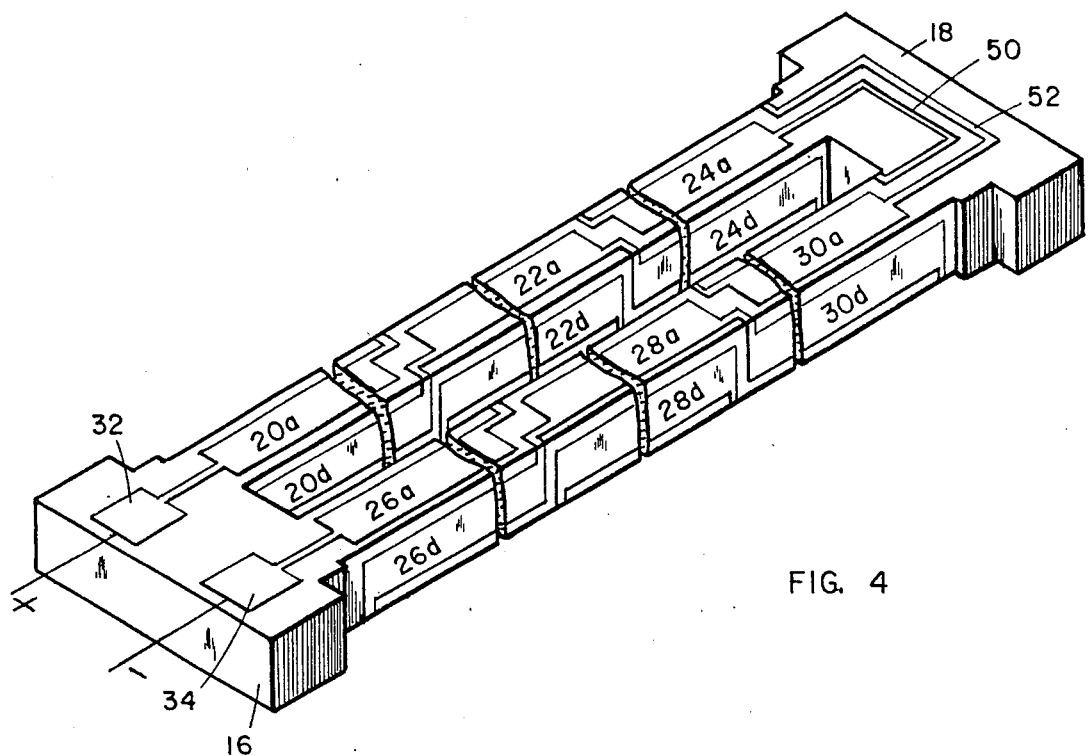
FIGS. 4 and 5 are perspective views of a DTF in accordance with the present invention, shown from different angles.
Figure 5:
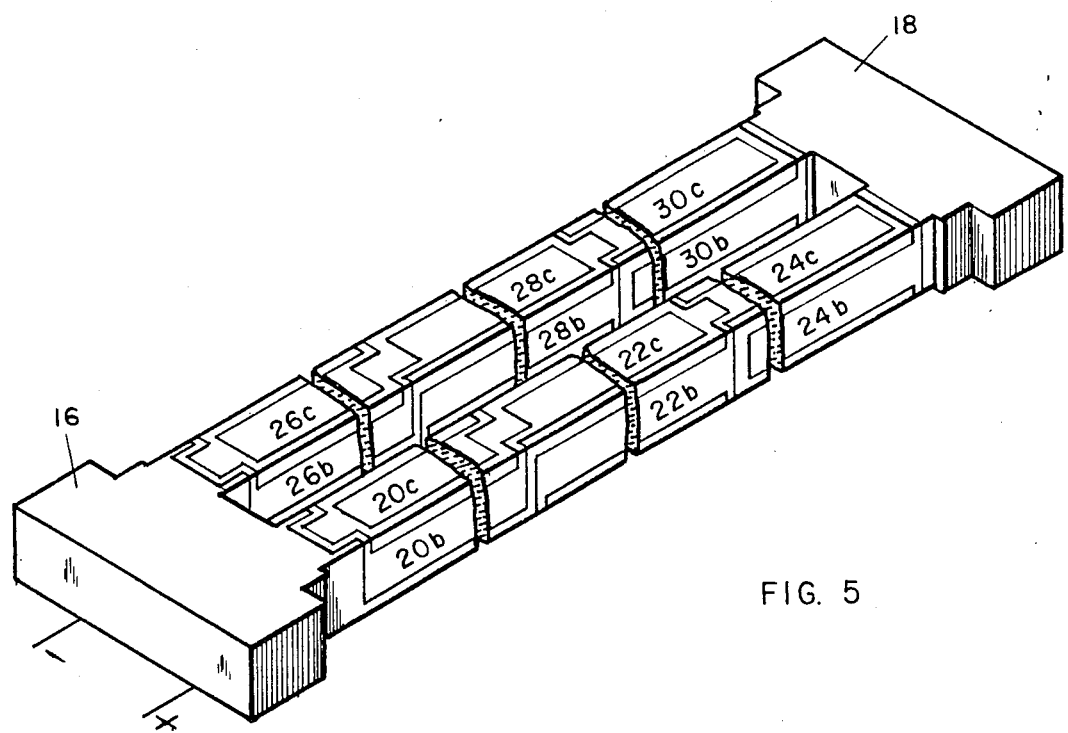

Fail-safe operation of the DTF, in response to breakage of one of the tines, is achieved in the preferred embodiment of FIGS. 1, 4 and 5 by the employment of the above-described dual series circuit for energizing the electrodes, as schematically indicated at 42, 44 in FIG. 3. With such an arrangement, fracture of a tine 12 or 14 in any place results in interruption of one of the two energizing circuits for certain group(s) of electrodes, and interruption of the other energizing circuit for the remaining group(s) of electrodes. For example, considering a transverse fracture of one tine 12 at a point "X" (FIG. 3) between two groups of electrodes, one of the energizing circuits 42 is interrupted for all electrode groups beyond that break point (i.e. between the break point and the dead end point 42b), while the other energizing circuit 44 is interrupted for all electrode groups ahead of the break point (i.e. between that break point and the other dead end point 44b). Thus, every group of electrodes will include one de-energized pair of electrodes so that no bending force will be developed by any of the electrode groups and hence no vibratory motion will be produced. To put it differently, if either tine fractures, then one of the two series circuits on the remaining tine will be de-energized, and thus no vibratory movement can be imparted to that remaining tine.

It has been found that a DTF can be expected to fracture at places other than directly at one of the tines. For example, referring still to FIG. 3, there is a realistic possibility of transverse fracture in the regions adjacent the ends of the tines 12, 14, identified as Zones A and B respectively. With the connection lead arrangement shown, such fracture will cause at least part of both of the dual series circuits 42, 44 to be de-energized, even though the tines themselves have not fractured, and thereby prevent vibratory excitation of either tine.

For example, if a transverse fracture occurs in Zone A, both circuits on both tines will be interrupted at the very beginning and thus de-energized. Vibration will of course cease. Alternatively, if fracture occurs in Zone B, both series circuits 42, 44 will be interrupted beyond the remote ends of the tines, thereby (as in the example of point "X" in a preceding paragraph) de-energizing one opposed pair of electrodes in every group of four electrodes. Thus, even though parts of these circuits 42, 44 ahead of the break point are able to energize corresponding pairs of electrodes (i.e. between the respective pad 32 or 34 and the break point), the counterpart pairs of electrodes of such groups will not be energized, and thus there will be no vibratory excitation of the corresponding regions of the tines. To assure fail-safe operation upon fracture in Zone B, it is important to arrange the series energizing circuitry to pass over that zone, just beyond the ends of the tines, as shown in FIG. 3.

Another way of detecting failure of the DTF is illustrated in FIG. 1. There, an impedance monitor 60 is coupled to the oscillator 38 to respond to changes in the impedance presented by the DTF. If a tine breaks, the impedance will increase sharply. The impedance monitor 60 produces, in response to such change in impedance, an output signal which can be employed in various ways. For example, the output signal can as shown be directed to the frequency meter 40 to disable the meter, so that its zero output indication will show that the sensor has failed.

Figure 7:
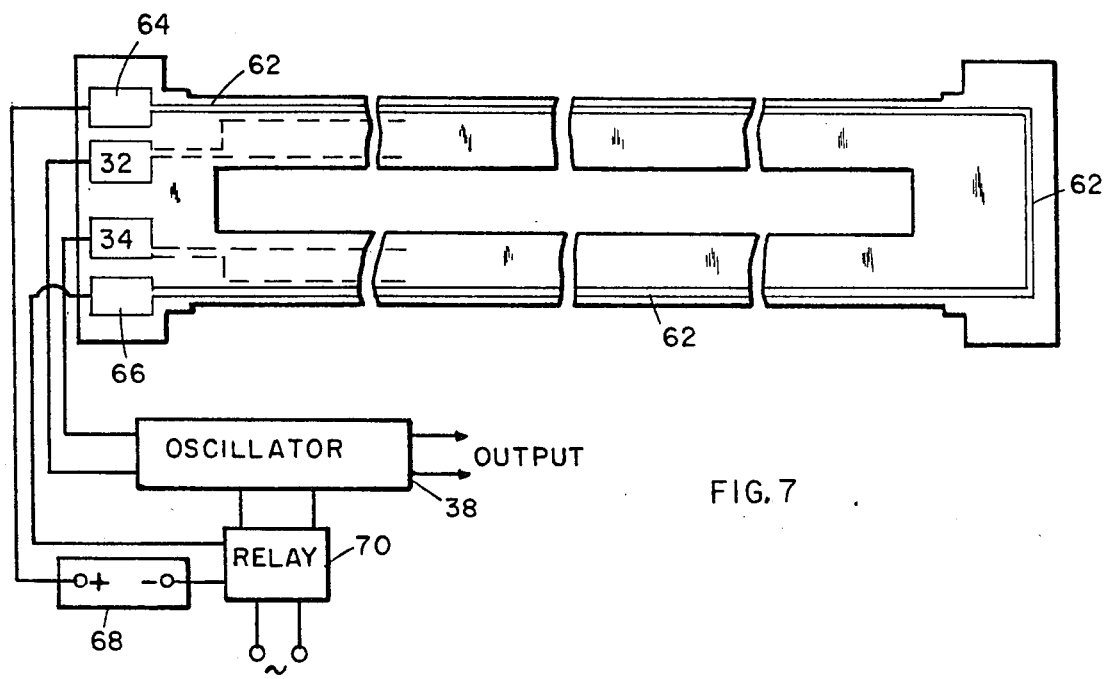
FIG. 7 shows another embodiment with separate electrical circuitry means to provide fail-safe operation.

As shown in FIG. 7, a separate series circuit 62 can be provided on the DTF and coupled through additional terminal pads 64, 66 to a power supply 68 in series with a relay 70. If the circuit 62 is interrupted by breakage of a tine, the relay drops out and interrupts the power to the oscillator 38, thereby causing the sensor output to go to zero. This provides a fail-safe indication of failure. Alternatively, the series circuit could be used as a fuse link in the oscillator power circuit.

The arrangement of FIG. 7 is less advantageous than the preferred embodiment of FIG. 1 because it requires additional connections to the DTF. That is, a four-wire (or with certain modifications a three-wire) connection is required rather than the two-wire circuit of FIG. 1.

Figure 8:
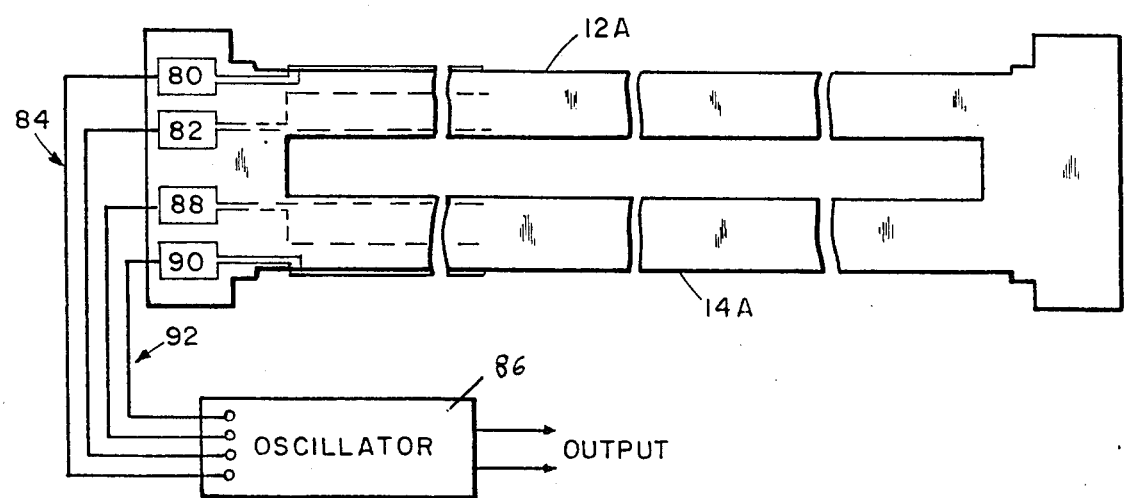
FIG. 8 shows still another embodiment wherein the electrodes of one tine are driven, and the electrodes of the remaining tine serve as receiver elements.

Referring to FIG. 8, still another way of enabling detection of breakage of a tine is to employ the electrodes on one tine 12A as drive electrodes, by connecting those electrodes through a pair of terminal pads 80, 82 and a pair of wires 84 to the oscillator 86, and to employ the electrodes of the other tine 14A as receive electrodes, to pick up the consequent vibrations of that tine and to direct the resultant signal through another pair of terminal pads 88, 90 and a second pair of wires 92 back to the oscillator. Thus, if either tine breaks, one or the other of the circuits 84 or 92 is effectively disabled so as to interrupt the feedback path of the oscillator, thereby preventing operation of the oscillator 86 and thus indicating failure of the sensor.

Although several embodiments of the invention have been described herein in detail, this has been for the purpose of illustrating the principles of the invention, and should not necessarily be construed as limiting of the invention since it is apparent that those skilled in the art can make many modified arrangements of the invention without departing from the true scope thereof.

What is claimed is:

1. In a double-tuning-fork (DTF) resonator having two side-by-side tines joined at their ends by first and second support segments, said tines having first and second sets of electrodes distributed along the surfaces of both of said tines to be activated by a source of alternating current energy to produce vibration of said tines at the resonant frequency thereof;

the improvement for assuring that failure of said resonator will be known in the event that fracture occurs in part of said DTF, comprising:

circuit means forming part of said DTF and operable in the event of said fracture to develop an electrical circuit characteristic representative of said fracture; and means responsive to development of said electrical circuit characteristic for indicating failure of said DTF as a result of said fracture.

2. Apparatus as claimed in claim 1, wherein said circuit means comprises series circuitry passing down one tine of the DTF to the end thereof, across the segment at that end to the other tine, and back up said other tine to provide for interruption of said series circuitry by breakage of either of said tines.

3. Apparatus as claimed in claim 2, wherein said responsive means comprises electrical means coupled to said series circuitry and operable to produce a failure indication in response to any interruption of said series circuitry caused by said tine breakage.

4. In a double-tuning-fork (DTF) resonator having two side-by-side tines joined at their ends by first and second support segments, said tines having first and second sets of electrodes distributed along the surfaces of both of said tines to be activated by a source of alternating current energy to produce vibration of said tines at the resonant frequency thereof;

the improvement for assuring fail-safe operation of said resonator in the event that said DTF is fractured in the regions near the ends of said tines or in one of said tines, comprising:

series circuitry passing down one tine of the DTF to the end thereof, across the segment at that end to the other tine, and back up said other tine to provide for interruption of said series circuitry by fracture in said regions or either of said tines; and electrical means coupled to said series circuitry and operable to produce a failure indication in response to any interruption of said series circuitry caused by said fracture.

5. Apparatus as claimed in claim 4, wherein said series circuitry is a dual-series circuit comprising a first series circuit connected to a first set of said electrodes and a second series circuit connected to a second set of said electrodes;

said first and second sets of electrodes together constituting all of the electrodes of said DTF.

6. Apparatus as claimed in claim 5, wherein said first set of electrodes is distributed between said first and second tines, and said second set of electrodes also is distributed between said first and second tines.

7. Apparatus as claimed in claim 6, wherein said second set of electrodes comprise opposed electrode pairs which are counterparts to corresponding opposed pairs of said first set of electrodes, said two sets of electrodes being cooperative when energized at opposite a-c polarities to produce vibration of said tines.

8. Apparatus as claimed in claim 4, wherein said series circuitry comprises a serial circuit independent of any circuitry for activating said electrodes.

9. Apparatus as claimed in claim 8, including an oscillator coupled to said DTF electrodes to produce an oscillatory signal at the resonant frequency of said DTF; and means responsive to interruption of said series circuit for deactivating said oscillator.

10. In a double-tuning-fork (DTF) resonator having two side-by-side tines joined at their ends by first and second support segments, said tines having first and second sets of electrodes distributed along the surfaces of both of said tines for coupling to a source of alternating current energy for activating said electrodes to produce vibration of said tines at the resonant frequency thereof;

that improvement for assuring fail-safe operation of said resonator in the event that one of said tines breaks, comprising:

first circuit means for electrically activating said first set of electrodes comprising a first serial circuit connected to all of the electrodes of said first set, said first serial circuit extending down said first tine to the end thereof, across said second support segment, and back up said second tine; and second circuit means for electrically activating said second set of electrodes comprising a second serial circuit connected to all of the electrodes of said second set of electrodes, said second serial circuit extending down said second tine to the end thereof, across said second support segment, and back up said first tine.

11. Apparatus as claimed in claim 10, wherein said first set of electrodes comprises pairs of electrodes on opposite surfaces of a tine of said DTF;

said second set of electrodes also comprising pairs of electrodes on opposite surfaces of a tine of said DTF, with each pair of said second set interleaved with a counterpart pair of said first set of electrodes.

12. Apparatus as claimed in claim 10, wherein said first series circuit is connected at its beginning to a first terminal pad on said resonator;

said second series circuit being connected at its beginning to a second terminal pad on said resonator.

13. In a double-tuning-fork (DTF) resonator having two side-by-side tines joined at their ends by first and second support segments, said tines having first and second sets of electrodes distributed along the surfaces of both of said tines for coupling to a source of alternating current energy for activating said electrodes to produce vibration of said tines at the resonant frequency thereof;

that improvement for assuring fail-safe operation of said resonator in the event that one of said tines breaks, comprising:

an oscillator coupled to said electrodes for developing an oscillator signal at the resonant frequency of the DTF;

an impedance monitoring circuit coupled to said oscillator and responsive to the impedance presented by said DTF; and means for developing a failure indication when the impedance of said DTF changes in response to breakage of one of said tines.

14. Apparatus as claimed in claim 13, including frequency-responsive means coupled to said oscillator; and means responsive to said impedance monitoring circuit for deactivating said frequency-responsive means when a tine breaks.

15. In a double-tuning-fork (DTF) resonator having two side-by-side tines joined at their ends by first and second support segments, said tines having first and second sets of electrodes distributed along the surfaces of both of said tines for coupling to a source of alternating current energy for activating said electrodes to produce vibration of said tines at the resonant frequency thereof;

that improvement for assuring fail-safe operation of said resonator in the event that one of said tines breaks, comprising:

oscillator means coupled to the electrodes on one of said tines to deliver oscillatory energy thereto to produce vibration of said one tine; and receiving means coupled to the electrodes on the other of said tines to receive the signals produced in response to vibration of said other tine;

whereby if either tine breaks, the output of said receiving means will cease and thereby indicate failure of said DTF.

16. In a double-tuning-fork (DTA) resonator having two side-by-side tines joined at their ends by first and second support segments, said tines having first and second sets of electrodes distributed along the surfaces of both of said tines to be activated by a source of alternating current energy to produce vibration of said tines at the resonant frequency thereof;

the improvement for assuring that failure of said resonator will be known in the event that one of said tines breaks, comprising:

circuit means forming part of said DTF and operable in the event of breakage of either of said tines to develop an electrical circuit characteristic representative of said breakage; and means responsive to development of said electrical circuit characteristic for indicating failure of said DTF as a result of said breakage.

17. In a double-tuning-fork (DTF) resonator having two side-by-side tines joined at their ends by first and second support segments, said tines having first and second sets of electrodes distributed along the surfaces of both of said tines to be activated by a source of alternating current energy to produce vibration of said tines at the resonant frequency thereof;

the improvement for assuring fail-safe operation of said resonator in the event that one of said tines breaks, comprising:

series circuitry passing down one tine of the DTF to the end thereof, across the segment at that end to the other tine, and back up said other tine to provide for interruption of said series circuitry by breakage of either of said tines; and electrical means coupled to said series circuitry and operable to produce a failure indication in response to any interruption of said series circuitry caused by said tine breakage.

* * * * *